(12) United States Patent
Karkowski et al.

(10) Patent No.: US 6,351,395 B1
(45) Date of Patent: Feb. 26, 2002

(54) BACKPLANE SUPPORT BRACKET

(75) Inventors: Andrew J. Karkowski, Carol Stream; Arcangel N. Capulong, Mundelein, both of IL (US)

(73) Assignee: AG Communication Systems Corporation, Phoenix, AZ (US)

( * ) Notice: Subject to any disclaimer, the term of this patent is extended or adjusted under 35 U.S.C. 154(b) by 0 days.

(21) Appl. No.: 09/732,255

(22) Filed: Dec. 8, 2000

(51) Int. Cl.⁷ ................................................. H05K 7/14
(52) U.S. Cl. .................... 361/825; 361/801; 174/138 G; 248/220.22; 403/404
(58) Field of Search ............................... 361/732, 759, 361/807, 801, 825, 826; 439/527, 55; 174/138 G; 403/404, 408.1; 312/265.6; 248/200, 207, 220.1, 220.22

(56) References Cited

U.S. PATENT DOCUMENTS 5,117,330 A * 5/1992 Miazga ........................ 361/760
5,674,023 A * 10/1997 Williams ..................... 403/231
5,947,571 A * 9/1999 Ho ............................ 312/265.6
6,128,202 A * 10/2000 Senechal et al. ............. 361/825

* cited by examiner

Primary Examiner—Jayprakash N. Gandhi
(74) Attorney, Agent, or Firm—David J. Zwick

(57) ABSTRACT

A backplane support bracket comprising a flange with opposing engaging tabs extending downward, and a flange extension arm with a connecting tab also extending downward. The opposing engaging tabs and flange fit over a frame module support cross-member in close fit, and the connecting tab is secured to a cable connector of a connector bank using a cable connector mounting screw located along a backplane edge strip of a cutout. With one or more backplane support brackets so installed, the bracket greatly reduces flexing of the cutout edge strip when cables are inserted and removed from the cable connector bank and circuit cards are inserted into the backplane.

2 Claims, 4 Drawing Sheets

BACKPLANE SUPPORT BRACKET

FIELD OF THE INVENTION

The present invention relates to hardware for securing backplanes to a frame module, and more particularly to a support bracket that provides structural support for areas of a backplane having large cutouts.

BACKGROUND OF THE INVENTION

Backplane circuit boards need to be attached to a frame module in such a way so as to withstand the perpendicular forces applied to the backplane when circuit cards are inserted from the front of the module, and when cables are installed and removed from the back of the module. Securing the backplane to a frame module is typically done by attaching the backplane along the top and bottom edges and across the board center to extrusion module support cross-members by a number of screws. To accommodate pass-through cable connectors that are normally mounted very close to the board edge and would interfere with the support cross-members, standoffs are used between the backplane and the support cross-members. The attachment screws go through the standoffs and serve to hold the standoffs in place. The number and placement of connections attaching the backplane to the support cross-members is governed by the minimum number of connections structurally required by the backplane, and space available on the backplane board.

As the density of components on backplanes increases, there is a problem in locating enough positions on the backplane for support connections. This is a particular problem where a bank of pass-through cable connectors requires a large cutout, and the closely packed cable connectors do not allow room for support connections along the backplane edge. This leaves a relatively long narrow strip at the edge of the backplane board structurally unsupported that is vulnerable to fatigue, cracking and breaking with repeated insertion and removal of cables from the cable connectors, and that also allows the backplane board to deflect when printed circuit cards are inserted, possibly resulting in the circuit card not being properly seated.

SUMMARY OF THE INVENTION

Accordingly, it is an object of the present invention to provide a backplane support bracket that will provide structural support to the backplane along the backplane edge strip of the cutout for a bank of cable connectors without requiring access to the backplane edge strip between the cable connectors.

The invention of Applicants is a backplane support bracket comprising a flange with opposing engaging tabs extending downward, and a flange extension arm, extending from the flange generally in the direction joining the two opposing engaging tabs, with a connecting tab also extending downward. The opposing engaging tabs and flange fit over the module support cross-member in close fit, and the connecting tab is secured to one of the cable connectors of the bank using a cable connector mounting screw located along the backplane edge strip of the cutout. With one or more backplane support brackets so installed, the bracket greatly reduces flexing of the cutout edge strip when cables are inserted and removed from the cable connector bank and when circuit cards are inserted and removed from the board.

DESCRIPTION OF THE PREFERRED EMBODIMENT

Figure 1:
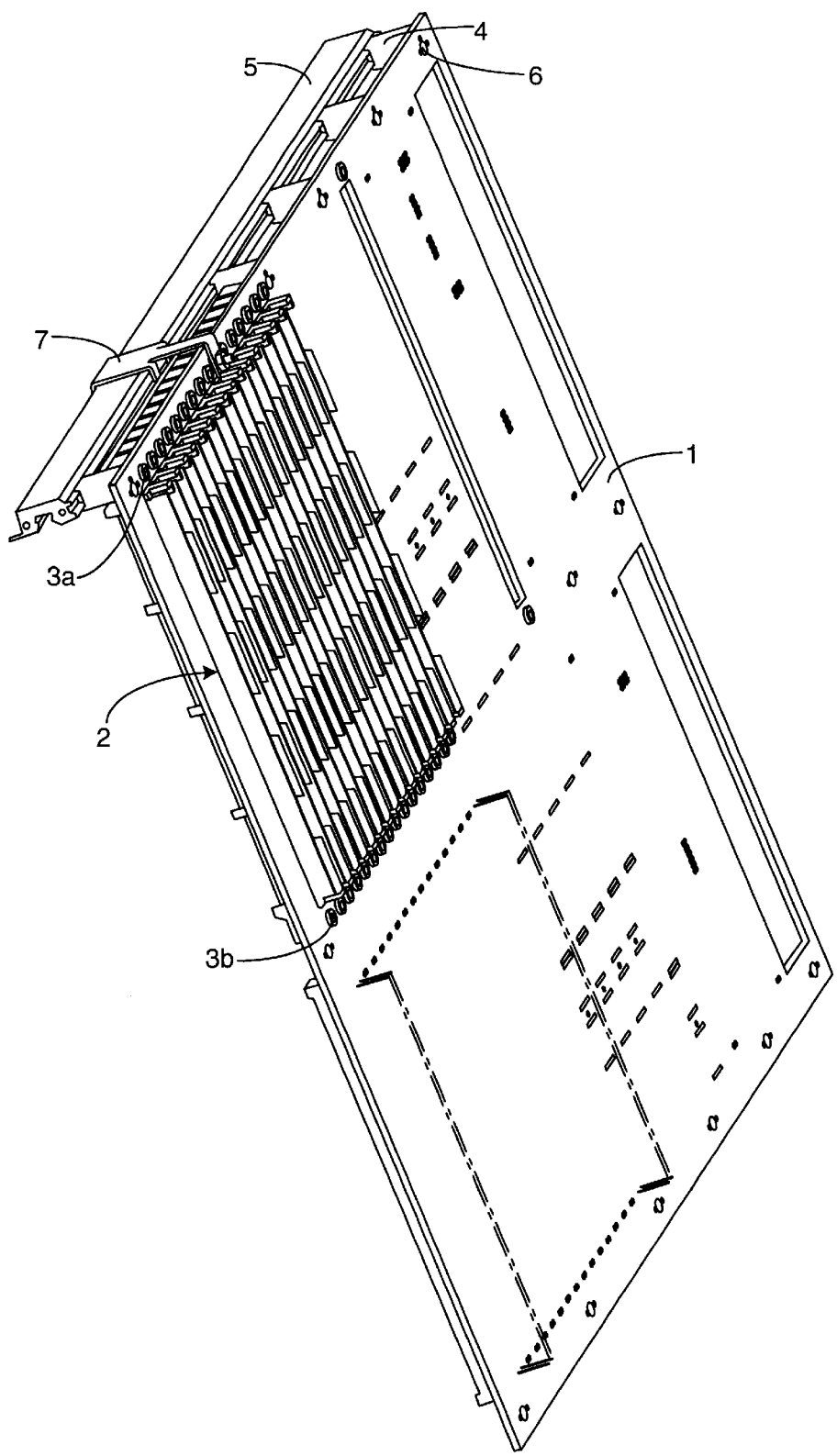
FIG. 1 shows the backside of a backplane board illustrating the prior art method of attachment and also a preferred embodiment of the present invention.

FIG. 1 shows the backside of backplane board 1 illustrating the prior art method of attachment and also a preferred embodiment of the present invention. Backplane 1 has installed in a backplane cutout a bank 2 of one or more cable connectors. Each connector of bank 2 is secured to the backplane by connecting screws (not shown) that extend through a shoulder grommet 3a at the top edge strip of the cutout, and a shoulder grommet 3b at the bottom of the cutout and are secured by tightening a nut onto the screw. Shoulder grommets 3a and 3b are inserted in through holes of backplane 1 such that the shoulder rests on the backside of backplane 1, and the connecting screws extend from the front side through mounting holes of the cable connector through the shoulder grommets 3a and 3b and nuts are tightened onto the screws, thereby securing the cable connector to the backplane.

Figure 2:
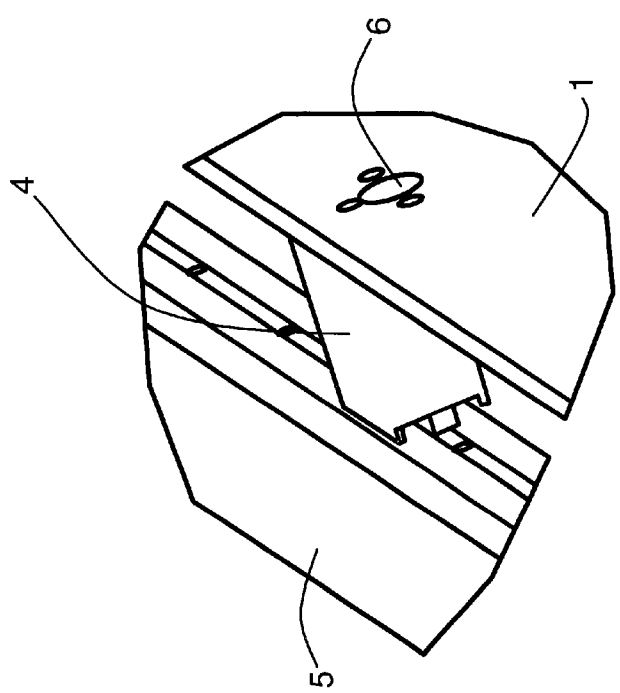
FIG. 2 shows a detailed illustration of the prior art method of attachment.

Backplane 1 is attached to a frame module by securing backplane 1 to extrusion module support cross-member 5 via standoffs 4. Support cross-member 5 has sides adjacent and opposite backplane 1. A particular shape for support cross-member 5 is shown, however any shape that serves to provide support to backplane 1 can be used. Standoffs are required so that the cable connectors of bank 2 do not interfere with module support cross-member 5. FIG. 2 shows a detailed illustration of the prior art standoff method of attaching the backplane board to the frame module. Standoff 4 is interposed between backplane 1 and the adjacent edge of extrusion module support cross-member 5. A screw (not shown) screws through screw hole 6, through a hole in standoff 4, and into a hole drilled into module support cross-member 5. Standoff 4 typically has small feet that engage channels and other features along the adjacent edge of module support cross-member 5 to aid in the stability of the attachment of backplane 1 to module support cross-member 5. Backplane 1 is secured to the frame module via a number of standoffs 4 that attach backplane 1 to extrusion module support cross-members located along the upper edge, lower edge and along the midpoint of backplane 1. The number and placement of standoffs for attachments of backplane 1 to support cross-members 5 of the frame module is governed by the minimum number of connections structurally required by the backplane, and space available on the backplane board.

As shown in FIG. 1, the position of cable connector bank 2 at the top edge of backplane 1, the position required to accommodate the component density of backplane 1, does not allow the use of standoffs 4 to secure the narrow edge strip of backplane 1 along the top of the cable connector bank cutout. Without some means to support this edge strip, there is the possibility that the flexing of the edge strip from repeated insertion and removal of cables from cable connector bank 2 will cause fatigue, cracking and breaking of the strip, and that insertion of circuit cards will cause the board to flex and possibly cause the cards to not seat properly.

Figure 3:
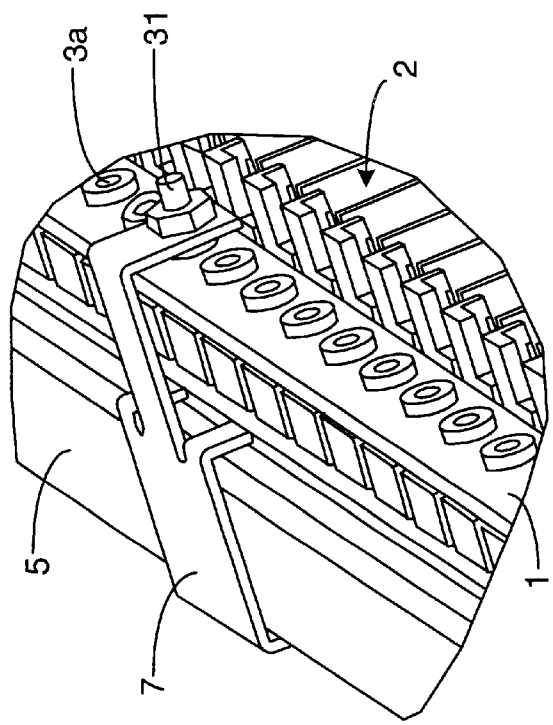
FIG. 3 shows a detailed illustration of a preferred embodiment of the present invention as installed on a backplane.

FIG. 3 shows a detailed illustration of a preferred embodiment of the backplane support bracket 7 of the present invention as installed on backplane 1. Opposing engaging tabs extend perpendicularly downward from a flange and fit over module support cross-member 5 in a close fit. A flange extension arm, extending from the flange in the direction joining the two opposing engaging tabs, has a connecting tab also extending perpendicularly downward that is secured to backplane 1 by a cable connector mounting screw 31 of one of the cable connectors of bank 2. When support bracket 7 is secured to backplane 1, the close fit of the opposing engaging tabs over module support cross-member 5 serves to limit motion of the narrow edge strip of the cutout when cables are installed and removed from cable connector bank 2 or cards are inserted into the board. Although only one support bracket 7 is shown as installed, several brackets may be installed as needed.

Figure 5:
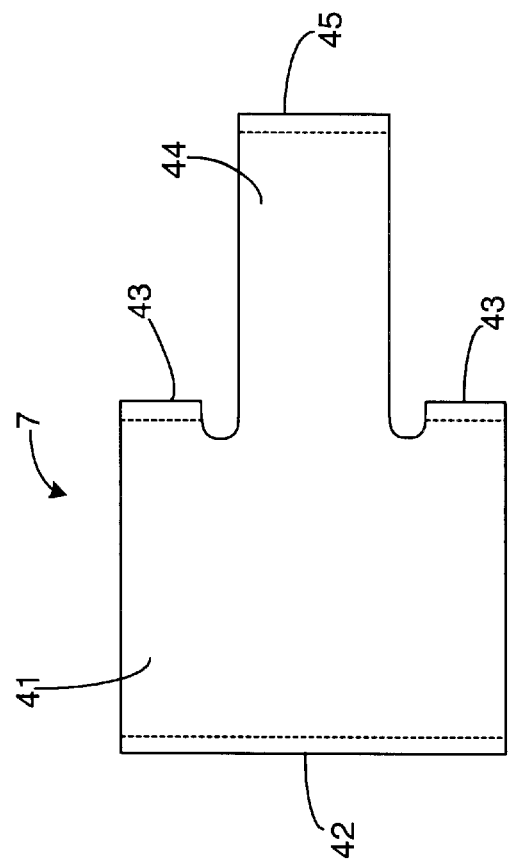
FIG. 5 is a top view of a preferred embodiment of the backplane support bracket of the present invention.
Figure 4:
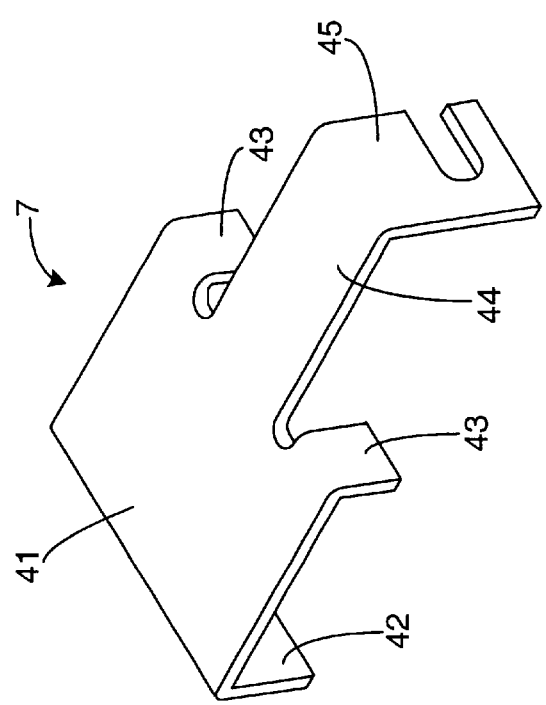
FIG. 4 is an isometric view of a preferred embodiment of the backplane support bracket of the present invention.
Figure 6:
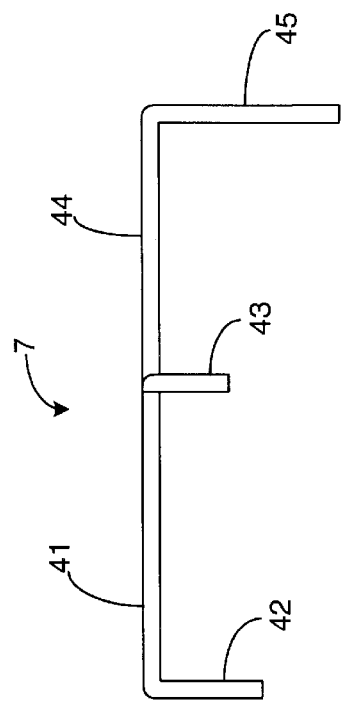
FIG. 6 is a side view of a preferred embodiment of the backplane support bracket of the present invention.

FIGS. 4, 5, and 6 show various views of a preferred embodiment of support bracket 7 of the present invention. Flange 41 has opposing engaging tabs 42 and 43 that extend perpendicularly downward from flange 41. Flange extension arm 44 extends from flange 41 in the direction joining opposing engaging tabs 42 and 43. Flange extension arm 44 has a slotted connecting tab 45 also extending perpendicularly downward.

In the preferred embodiment, support bracket 7 is stamped and formed from 0.0598 inch CR steel sheet with a zinc plate clear chromate finish. In the invention of Applicants, any suitable material and process may be used to form backplane support bracket 7.

Figure 7:
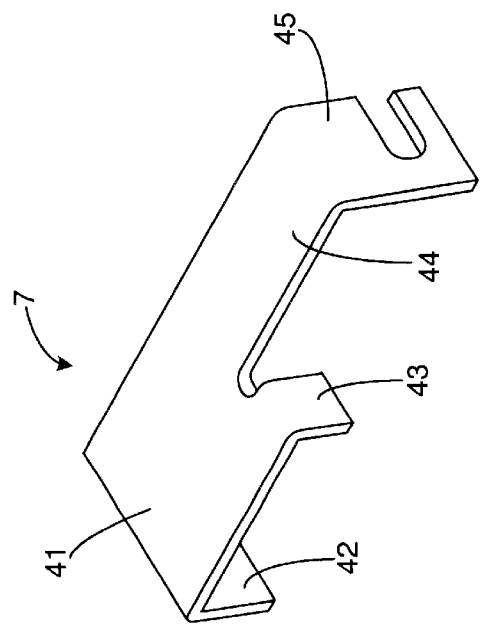
FIG. 7 is an isometric view of a second preferred embodiment of the backplane support bracket of the present invention.

FIG. 7 is an isometric view of a second preferred embodiment of the backplane support bracket of the present invention. In this embodiment, a different geometry of the opposing engaging tabs is illustrated, wherein a single engaging tab 43 is used, giving support bracket 7 an asymmetrical appearance. The operation of this embodiment is the same as for the embodiment shown in FIGS. 4, 5 and 6.

In operation, support bracket 7 is positioned over module support cross-member 5 such that opposing engaging tabs 42 and 43 are positioned closely adjacent and outside of the adjacent and opposite edges of support cross-member 5. Support bracket 7 is positioned laterally along support member 5 such that the slot of flange extension arm connecting tab 45 is aligned on the backside of backplane 1 with one of the shoulder grommets of cable bank 2. Cable connector mounting screw 31 is then installed in normal fashion while extending through the slot of slotted connecting tab 45. The associated nut of screw 31 is then engaged on screw 31 and tightened, thus securing the cable connector and also support bracket 7 to backplane 1. Thus installed, support bracket 7 provides support to the narrow edge strip of the cable bank 2 cutout of backplane 1 against flexing of the edge strip caused by insertion and removal of cable connectors from cable bank 2 and the insertion of cards into the backplane.

While preferred embodiments of the backplane support bracket invention of Applicants have been particularly shown and described, they are not intended to be exhaustive nor limit the invention to the embodiments disclosed. It will be apparent to those of ordinary skill in the art that modifications to the preferred embodiments can be made without departing from the scope and spirit of the invention. In the invention of Applicants, the key aspects of the invention are opposing engaging tabs 42 and 43 that are positioned about support cross-member 5, connecting tab 45 including means to connect connecting tab 45 to one of the cable connector mounting screws 31, and a flange structure to which tabs 42, 43 and 45 are attached. The relative positioning of tabs 42, 43 and 45, and the number of opposing tabs 42 and 43, is not critical as long as, when connecting tab 45 is secured by a cable connector mounting screw 31, engaging tabs 42 and 43 engage support cross-member 5 so as to limit flexing of the backplane edge strip of the cable bank 2 cutout. For example, while the preferred embodiments show tabs 42, 43 and 45 aligned generally in a direction perpendicular to the long axis of support cross-member 5, the tabs may be aligned at an oblique angle relative to the long axis to reduce cable insertion and removal flex for cable connectors having an angle of insertion also at an oblique angle. Also, the shapes of flange 4 and flange extension arm 44 are not important as long as they serve to hold tabs 42, 43 and 45 in positions such that support bracket 7 limits flexing of the backplane edge strip of the cable bank 2 cutout, and do not interfere with other backplane and frame module structures. Also, while connecting tab 45 is shown in the preferred embodiments as having a slot that allows a cable connector mounting screw 31 to extend therethrough, and a corresponding nut to secure connecting tab 45 to a cable connector of bank 2, other means to connect connecting tab 45 to a cable connector are possible. For example, a slot similar to the one illustrated, but in other orientations will serve the required purpose. Also, a simple hole in connecting tab 45 will serve the required purpose. It is intended that the scope of the invention be defined by the claims appended hereto and their equivalents.

What is claimed is:

1. A backplane support bracket for use with a frame module support cross-member and a backplane having a cable connector bank mounted in a backplane cutout comprising one or more cable connectors, the cutout defining an edge strip adjacent the support cross-member, each cable connector having a cable connector mounting screw located along the edge strip, said backplane support bracket comprising:

a flange;

two or more opposing engaging tabs extending downward from said flange, said engaging tabs disposed closely adjacent and outside of the frame module support cross-member;

a flange extension arm extending from said flange; and a connecting tab extending downward from said flange extension arm, said connecting tab having connecting means to secure said connecting tab to a cable connector via a cable connector mounting screw;

whereby said support bracket limits flexing of the cutout edge strip caused by insertion and removal of cables from the cable connectors of the cable connector bank and by the insertion of printed circuit cards into the backplane.

2. A backplane support bracket according to claim 1, wherein:

said flange is rectangular in shape having first and second opposing edges;

one of said engaging tabs extends perpendicularly downward from and is coextant with said flange first edge;

two of said engaging tabs extend perpendicularly downward from said flange second edge, said two engaging tabs positioned fully apart from each other along said second edge; and said flange extension arm positioned between said two engaging tabs on said second edge, said flange extension arm coplanar with said flange and extending perpendicularly from said second edge.

* * * * *